(12) United States Patent
Tateyama (10) Patent No.: US 7,283,006 B2
(45) Date of Patent: Oct. 16, 2007

(54) VOLTAGE-CONTROLLED OSCILLATOR

(75) Inventor: Yuichi Tateyama, Sagamihara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 58 days.

(21) Appl. No.: 11/242,001

(22) Filed: Oct. 4, 2005

(65) Prior Publication Data

US 2006/0071731 A1    Apr. 6, 2006

(30) Foreign Application Priority Data

Oct. 4, 2004  (JP)  ............................. P2004-291576

(51) Int. Cl.
  *G04F 5/06*  (2006.01)
  *H03B 5/36*  (2006.01)
(52) U.S. Cl. .................... 331/116 FE; 331/116 R; 331/158; 331/160; 331/176; 331/177 V
(58) Field of Classification Search ................ 331/66, 331/116 R, 116 FE, 158, 160, 185, 176, 36 C, 331/177 V
  See application file for complete search history.

(56) References Cited

U.S. PATENT DOCUMENTS 5,801,596 A *  9/1998  Sakurai ...................... 331/176

6,040,744 A *  3/2000  Sakurai et al. .............. 331/176

FOREIGN PATENT DOCUMENTS

JP          11-220329 A       8/1999
JP          2003-318417 A     11/2003

* cited by examiner

*Primary Examiner*—Robert Pascal
*Assistant Examiner*—Ryan J Johnson
(74) *Attorney, Agent, or Firm*—McDermott Will & Emery LLP (57) ABSTRACT

An oscillator circuit configured by a feedback resistance 1, an amplifier 2 and a quartz vibrator 3 has a load resistance. MOS transistors 5, 6 short-circuited at source and drain terminals has a capacitance, as a variable capacitance, occurring at between the source-drain terminal and gate terminal. A series connection of DC-cut capacitance 8, 9 and variable capacitance (MOS transistor 5, 6) is configured between one and the other terminals of the quartz vibrator 3 and an AC ground terminal. For example, a threshold voltage control signal for MOS transistor 5, 6 is inputted to the source-drain terminal through a high-frequency removing circuit 10, 11. Meanwhile, a signal that a temperature compensation control signal and an external voltage frequency control signal are superimposed together is inputted to the gate terminal. This makes it possible to desirably determine an output bias to a temperature compensation control circuit and an external voltage frequency control circuit.

10 Claims, 7 Drawing Sheets

CAPACITANCE SWITCHOVER VOLTAGE

FIG. 8 (Related Art)

VOLTAGE-CONTROLLED OSCILLATOR

BACKGROUND OF THE INVENTION

1. Field of the Invention

The present invention relates to voltage-controlled oscillators, and more particularly to a voltage-controlled oscillator for use as a temperature-compensated quartz oscillator to be controlled under voltage.

2. Description of the Related Art

Recently, due to the rapid progress of mobile communication apparatuses such as cellular phones, those communication apparatuses are required many functional additions including temperature compensation performance, size reduction, raising use frequency and so on. Accordingly, in such a communication apparatus, there are requirements of temperature compensation performance, size reduction, raising use frequency, etc. for the quartz oscillator for use as a reference of communication frequency.

The temperature-compensation quartz oscillator is a quartz oscillator having a temperature compensation function and reduced in the frequency change due to temperature change, and broadly used as a reference frequency source for a cellular phone or the like. The voltage-controlled oscillator has a variable capacitance element capable of changing the capacitance value based on voltage, as a variable capacitance within an oscillation loop. By controlling the terminal voltage of the variable capacitance element, the oscillator is controlled in frequency by changing the load capacitance value. The temperature-compensation quartz oscillators include those that the temperature characteristic of quartz oscillator (piezoelectric vibrator) is to be cancelled by controlling the variable-capacitance terminal voltage of the voltage-controlled oscillator.

Recently, the effort toward size reduction is proceeded for the temperature-compensation quartz oscillator, in addition to phase noise reduction, startup time reduction, temperature-compensation accuracy increase and so on. The size reduction of quartz oscillator is requisite for realizing the size reduction of quartz oscillator. However, there is a general tendency that the ratio of frequency change to variable capacitance change decreases with reducing the size of quartz oscillator.

Accordingly, there is a need to increase the capacitance change amount relative to a control voltage as to a variable capacitance used as a load capacitance. For example, as shown in JP-A-2003-318417 and JP-A-11-220329, capacitance value change can be taken great for a control voltage change by use of the capacitance caused between the source-drain terminal and the gate terminal of a MOS transistor short-circuited at its source and drain terminals, thus improving the sensitivity increase in frequency change on the quartz oscillator (see FIG. 7).

Figure 8:
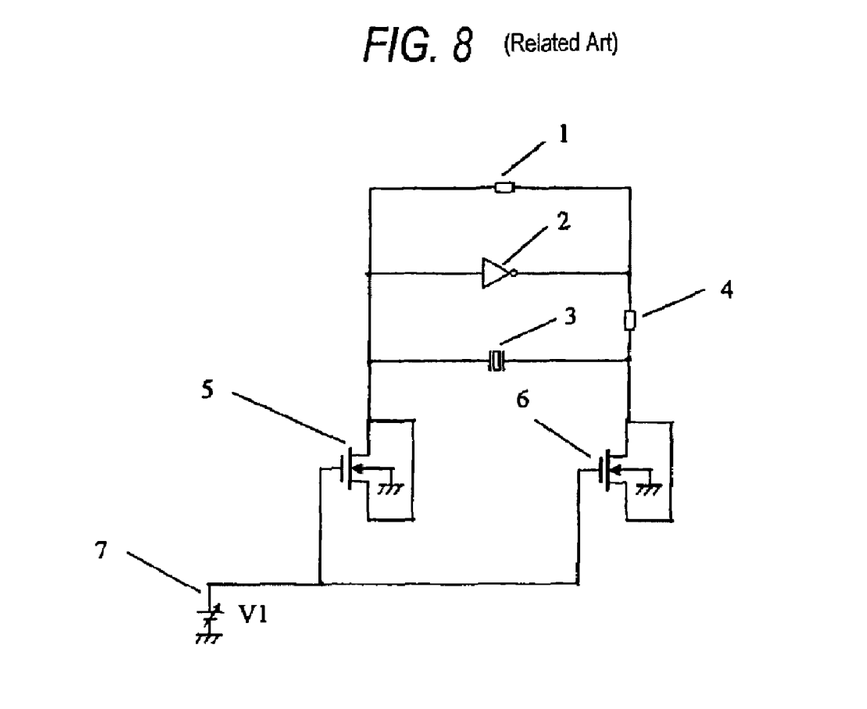
FIG. 8 is a circuit diagram showing a schematic configuration of a voltage-controlled oscillator in the prior art.

For example, as shown an example of voltage-controlled oscillator in FIG. 8, there is a proposal having an amplifier having a feedback resistance 1 and inverter 2, a piezoelectric vibrator 3, and first and second MOS transistors 5, 6 connected as variable capacitances to the respective terminals of the piezoelectric vibrator. In the variable capacitance, the first and second MOS transistors 5, 6 are short-circuited at the source-drain terminals. The capacitance, caused between the source-drain terminal and the gate of first and second MOS transistors, is controlled by a voltage source 7 connected to the gate terminal.

In the voltage-controlled oscillator, the capacitance caused between the source-drain terminal and the gate terminal of the MOS transistor is directly connected as a variable capacitance directly to the amplifier and quartz vibrator (piezoelectric vibrator) of an oscillation circuit. Frequency is controlled by changing the capacitance occurring between the source-drain terminal and the gate terminal due to control of the gate voltage of the MOS transistor. In this case, when the gate voltage of MOS transistor becomes a (source-drain terminal voltage + threshold voltage), a channel is formed underneath the gate oxide film, to increase the capacitance between the gate terminal and the channel, i.e. source-drain terminals. (This voltage is taken as a capacitance switchover voltage).

As a first problem of the conventional voltage-controlled oscillator described above, there is a problem that, because the DC bias at the drain terminal is determined on the amplifier side of oscillator circuit, the capacitance switchover voltage cannot be set at a desired value thus making it impossible to control the frequency about a desired gate voltage.

Meanwhile, as a second problem, in the usual CMOS process, the capacitance switchover voltage changes depending upon MOS transistor threshold variation and temperature characteristic. In the prior art, the temperature compensation control signal and external voltage frequency control signal is required to have a characteristic for canceling the MOS transistor threshold variation and temperature characteristic.

Furthermore, as a third problem, there is a problem that, because the capacitance value is great when it is equal to or smaller than the capacitance switchover voltage, frequency variable range is narrow. This is because that the frequency versus capacitance characteristic depicts an exponential curve and hence the frequency variable range relative to capacitance change is narrow in case the capacitance value is great when it is equal to or smaller than the capacitance switchover voltage.

For this reason, in order to facilitate the design of and put into practical use a quartz oscillator using a capacitance caused between the source-drain terminal and the gate terminal of a MOS transistor, there is a need to increase the capacitance occurring between the MOS transistor terminals or increase the capacitance by using an array structure, and further to control the MOS transistor threshold voltage control signal independently of the temperature compensation control signal and external voltage frequency control signal.

SUMMARY OF THE INVENTION

The present invention has been made in view of the foregoing circumstances, and it is an object thereof to provide a voltage-controlled oscillator which can be reduced in size without lowering the frequency variable range in the voltage-controlled oscillator.

Namely, it is an object to provide a voltage-controlled oscillator capable of controlling the threshold voltage of a MOS transistor independently of a temperature compensation control signal and external voltage frequency control signal by an improvement through preventing the capacitance value from increasing at a capacitance switchover voltage or lower of a capacitance occurring between the MOS transistor terminals.

In order to achieve the above object, a voltage-controlled oscillator according to the invention comprises: an amplifier having an inverter and a feedback resistance; a piezoelectric vibrator; and variable capacitance means formed by a variable capacitance provided as a load capacitance between both terminals of the piezoelectric vibrator, and first and second DC-cut capacitances; wherein the variable capacitance is configured by first and second MOS transistors; the first MOS transistor being short-circuited at source-drain terminal, which source-drain terminal and the gate terminal of the first and second MOS transistors are to cause a capacitance; oscillation voltages in opposite phases being to be applied to the source-drain terminal and the gate terminal, oscillation frequency being to be controlled according to a first control signal inputted to the source-drain terminal of the first MOS transistor and a second control signal inputted to the gate terminal of the second MOS transistor.

According to this configuration, because the capacitance value can be minimized and frequency variable amount can be increased at a capacitance switchover voltage or the lower by merely changing the connection of the first and second MOS transistors without increasing the number of elements, the device itself can be maintained in the reduced size. Meanwhile, by using the first and second control signals independently controllable, the capacitance switchover voltage can be controlled by controlling the MOS transistor threshold voltage, making it possible to change the frequency about a desired control voltage value. Meanwhile, because there is a phase difference of 180 degrees between the gate and source-drain terminals of the first and second MOS transistors, a MOS variable capacitance (varactor) has a capacitance value equivalent to a doubled capacitance value due to a mirror effect. Accordingly, it is possible to take great the ratio of frequency change to control voltage change of a MOS varactor, what is called a frequency variable sensitivity. Meanwhile, because the dynamic range of control voltage broadens, frequency change width can be taken great. This can reduce the size of the first and second MOS transistor, thus enabling chip size reduction.

Meanwhile, in the voltage-controlled oscillator according to the invention, the variable capacitance means is connected with the first and second DC-cut capacitances between both terminals of the inverter and both terminals of the piezoelectric vibrator.

According to this configuration, because the variable capacitance and the first and second DC-cut capacitances are in parallel connection in respect of capacitance value as considered from the piezoelectric vibrator, the first and second MOS transistors as variable capacitances can be increased in capacitance width absolute value.

Meanwhile, the voltage-controlled oscillator of the invention includes those the variable capacitance means is formed by a series connection of the first DC-cut capacitance, a variable capacitance and the second DC-cut capacitance, configured between the both terminals of the piezoelectric vibrator.

According to this configuration, because the capacitance value as considered from the piezoelectric vibrator is given a series connection of the first DC-cut capacitance, a variable capacitance and the second DC-cut capacitance. Although the first and second MOS transistors as the variable capacitance is decreased in capacitance width absolute value, there is a merit that negative resistance increases to reduce the startup time.

Meanwhile, the voltage-controlled oscillator of the invention includes those the first control signal is a signal that a temperature compensation control signal and an external voltage frequency control signal are superimposed together, the second control signal being a MOS transistor threshold voltage control signal.

According to this configuration, it is possible to suppress the variation in the piezoelectric vibrator temperature compensation and external voltage frequency.

Meanwhile, the voltage-controlled oscillator of the invention includes those the first control signal is a MOS transistor threshold voltage control signal, the second control signal being a signal that a temperature compensation control signal and an external voltage frequency control signal are superimposed together.

According to this configuration, the variation in temperature compensation and external voltage frequency can be suppressed.

Meanwhile, the voltage-controlled oscillator of the invention includes those the variable capacitance means has a plurality of variable capacitances, to control an oscillation frequency by inputting control signals independent of each other.

According to this configuration, capacitance variable width can be broadened.

Meanwhile, the voltage-controlled oscillator of the invention includes those terminals the first and second control signals are to be inputted has a circuit having a MOS transistor threshold voltage variation canceling function.

According to this configuration, it is possible to cancel the variation in MOS transistor threshold voltage and increase the yield.

Meanwhile, the voltage-controlled oscillator of the invention includes those terminals the first and second control signals are to be inputted has a circuit having a temperature characteristic variation canceling function.

According to this configuration, it is possible to cancel the variation in MOS transistor threshold voltage and increase the yield.

Meanwhile, the voltage-controlled oscillator of the invention includes those terminals the first and second control signals are to be inputted has a circuit having an adjusting circuit having a non-volatile storage medium storing an adjusting voltage.

According to this configuration, accurate adjustment is possible in case a previously determined adjusting threshold voltage is saved in a non-volatile storage medium so that adjustment can be made by reading out of the non-volatile storage medium.

In this manner, the capacitance value can be minimized and frequency variable amount can be increased at a capacitance switchover voltage or the lower due to the piezoelectric vibrator load capacitance and frequency characteristic. The capacitance switchover voltage can be controlled by controlling the MOS transistor threshold voltage independently of the temperature compensation control signal and external signal frequency control signal, thus enabling to change the frequency about a desired control voltage value.

According to the invention, by minimizing the capacitance value at a capacitance switchover voltage or lower, frequency extension is made possible. Meanwhile, by controlling the MOS transistor threshold voltage independently of the temperature compensation control signal and external signal frequency control signal, the capacitance switchover voltage can be controlled, thus enabling to change the frequency about a desired control voltage value.

Meanwhile, a signal for canceling MOS transistor threshold voltage variation and temperature characteristic can be inputted independently of the temperature compensation control signal and external signal frequency control signal, thus facilitating the design of the temperature compensation control circuit and external voltage frequency control circuit.

In this manner, there is provided an effect for placing into practical application the voltage-controlled oscillator using a capacitance between MOS transistor terminals.

DESCRIPTION OF THE PREFERRED EMBODIMENTS

With reference to the drawings, embodiments of the present invention will now be explained.

Figure 1:
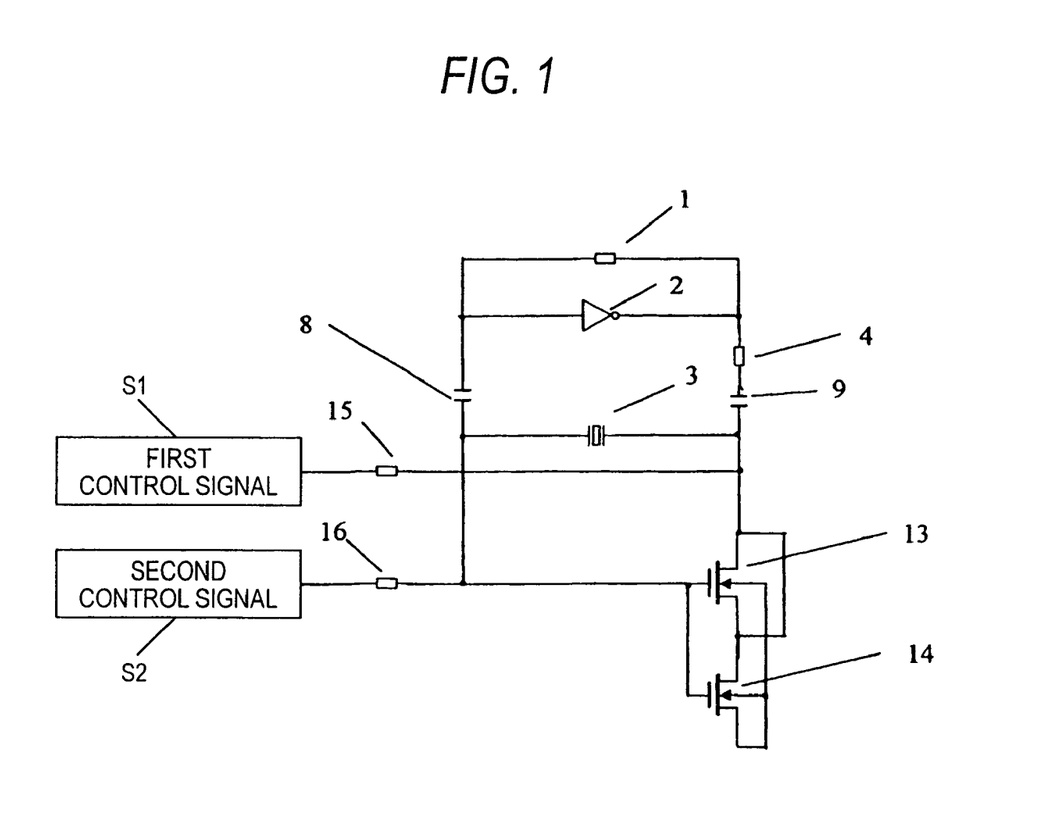
FIG. 1 is a circuit diagram showing a schematic configuration of a voltage-controlled oscillator in embodiment 1 of the present invention.

FIG. 1 is a circuit diagram showing a schematic configuration of a voltage-controlled oscillator in embodiment 1 of the invention.

Embodiment 1

In a voltage-controlled oscillator of embodiment 1, there are provided for example, as a variable capacitance, a first MOS transistor 13 short-circuited at its source and drain terminals, to which a second MOS transistor 14 is short-circuited at its source terminal. The first and second MOS transistors 13, 14 have back-gate terminals short-circuited to the source terminal of the second MOS transistor 14. Meanwhile, the first and second MOS transistors 13, 14 have gate terminals short-circuited together. Thus, a variable capacitance device is constituted using a capacitance at between the source and drain terminals of the first MOS transistor 13, the drain terminal of the second MOS transistor 14 and the gate terminals of the first and second MOS transistors.

Namely, the voltage-controlled oscillator shows an oscillator circuit constituted by an amplifier having a feedback resistance 1 forming feedback circuit and an inverter 2, a quartz oscillator 3, and a load resistance, as shown in FIG. 1. The load resistance is configured by a variable capacitance using a capacitance caused between the source and drain terminals of the first MOS transistor, the drain terminal of the second transistor and the gate terminals of the first and second MOS transistors.

Figure 7:
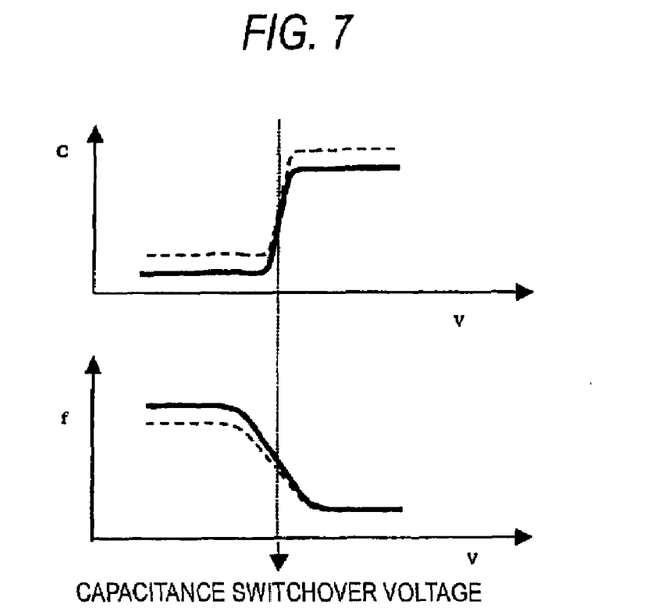
FIG. 7 is a figure showing a C-V characteristic and f-V characteristic explaining embodiment 1.

FIG. 7 shows a C-V characteristic and f-V characteristic of the capacitance occurring between the terminals of those MOS transistors. The characteristic using at between the conventional MOS transistors is shown by the broken line. From FIG. 7, the capacitance C varies sharply on a voltage added a threshold voltage to a voltage applied to one terminal. Because the voltage V can be desirably selected according to a MOS transistor threshold voltage control signal applied to the other terminal, a capacitance switchover voltage, i.e. frequency at which frequency is switched over, can be selected desirably. This makes it possible to desirably determine an output bias to a temperature compensation control circuit and external voltage frequency control circuit, thus facilitating the design.

Meanwhile, by applying a voltage reverse in characteristic to a variation and temperature characteristic as a MOS-transistor threshold voltage control signal, the temperature characteristic can be canceled. The capacitance switchover voltage variation and temperature characteristic can be canceled independently of the temperature compensation signal and external frequency control signal. Furthermore, the temperature compensation control circuit and external voltage frequency control circuit is made easy to design.

Meanwhile, in the embodiment 1, there is a phase variation of 180 degrees between the gate and the source-drain terminal of the MOS transistor. In this case, the MOS variable capacitance (varacter) becomes equivalent in capacitance to a doubled capacitance value due to a mirror effect, it is possible to take great the ratio of frequency change to control voltage change on the MOS varactor, what is called the frequency-variable sensitivity. Meanwhile, because the control voltage broadens in its dynamic range, frequency change width can be taken great. This can reduce the size of the first and second MOS transistor 13, 14, which contributes to the reduction in chip size.

Embodiment 2

Figure 2:
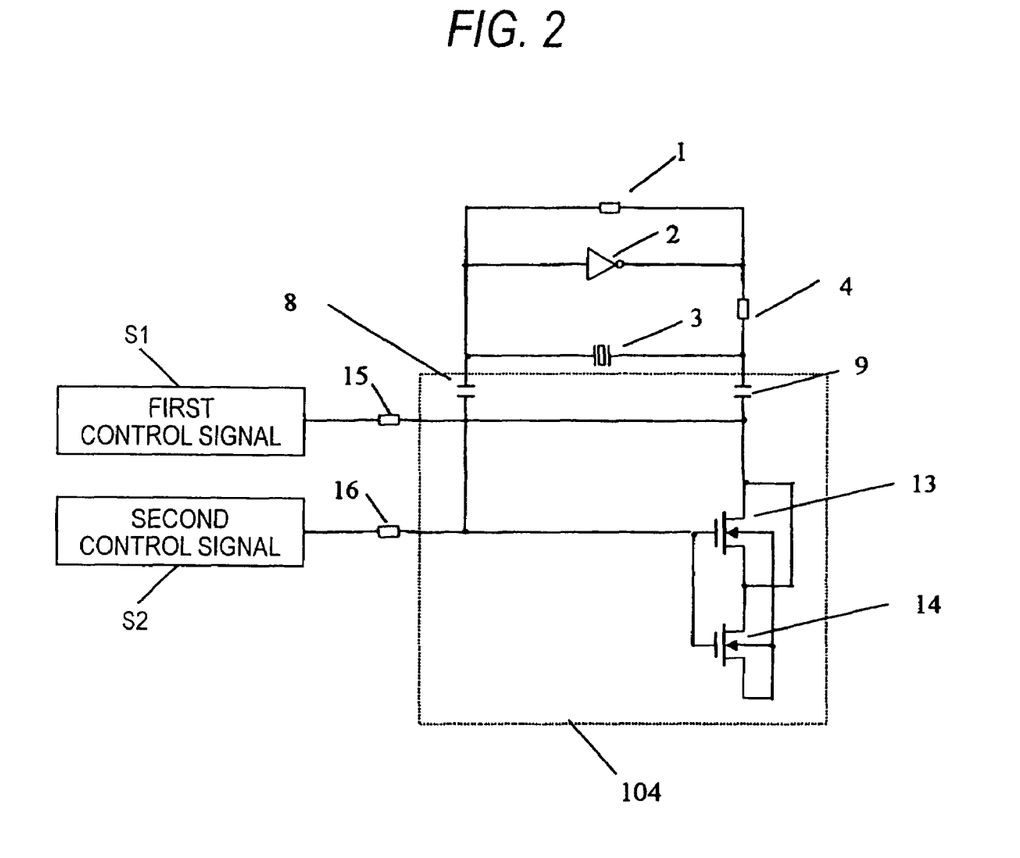
FIG. 2 is a circuit diagram showing a schematic configuration of a voltage-controlled oscillator in embodiment 2 of the present invention.

FIG. 2 is a circuit diagram showing a schematic configuration of a voltage-controlled oscillator in embodiment 2 of the invention.

Embodiment 2 shows an oscillation circuit constituted by a feedback resistance 1 forming feedback circuit, an amplifier 2 and a quartz oscillator 3. There is employed as a load capacitance a series connection 104 having a direct connection of a first DC-cut capacitance 8, a variable capacitance formed by the foregoing MOS transistors 13, 14 of the embodiment, and a second DC-cut capacitance 9.

Meanwhile, the first and second MOS transistors 13, 14, as a capacitance, has gate and source-drain terminals to which any of MOS transistor threshold value control signal or temperature compensation control signal and external voltage frequency control signal is to be inputted through a high-frequency removing resistance 15, 16.

The other is similar to that of embodiment 1 and omitted of explanation, thus attaching the same elements with the same references.

According to this configuration, although frequency variable range decreases than that of the voltage-controlled oscillator having the configuration of embodiment 1, the load capacitance as considered from a piezoelectric oscillator decreases. Thus, the oscillation circuit lowers in its negative resistance, enabling to improve the startup time for the voltage-controlled oscillation circuit.

Namely, this embodiment, because configured with MOS transistors as a variable capacitance, is to change the frequency 100 ppm or greater relative to the control voltage, thus securing a frequency change width sufficient for effecting temperature compensation and external frequency control. Because of no need for increasing the number of elements, size reduction is made possible. This enables to cope with a small-sized quarts oscillator.

Incidentally, embodiments 1 and 2 can be made to input any of a MOS transistor threshold voltage control signal or temperature compensation signal and an external voltage frequency control signal to the gate and source-drain terminals of the MOS transistor, as a capacitance, through a high frequency removing resistance 15, 16. This can reduce the variation in temperature characteristic and effect an external frequency control.

Figure 3:
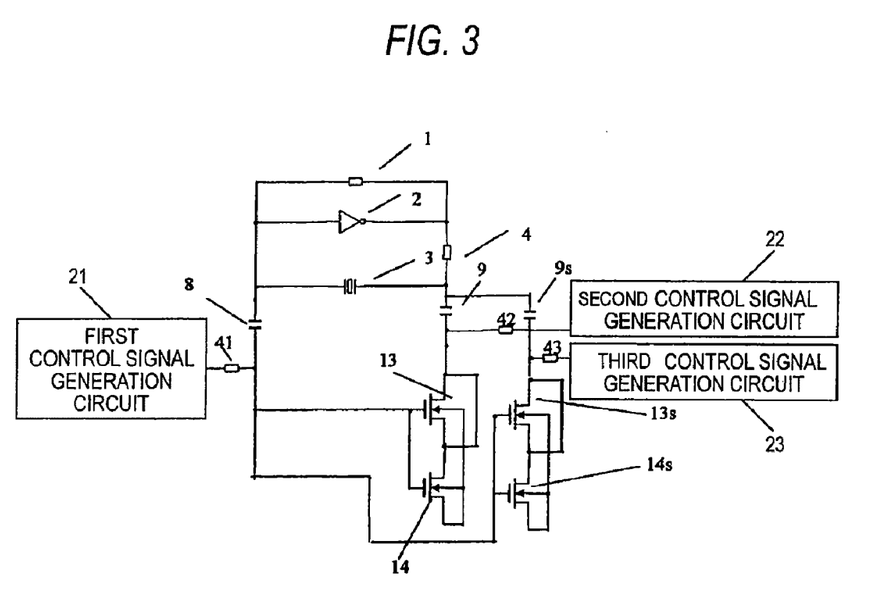
FIG. 3 is a circuit diagram showing a schematic configuration of a voltage-controlled oscillator having variable capacitance means in plurality in embodiment 3 of the invention.

FIG. 3 is a circuit diagram showing a schematic configuration of a voltage-controlled oscillator in embodiment 3 of the invention.

Embodiment 3 is characterized in that the MOS transistor is divided into a plurality as shown in FIG. 3 to form two sets of variable capacitances. This configuration enables to control the capacitance switchover voltage independently by means of a temperature compensation control signal and external voltage frequency control signal while performing control similarly to the showing in the first and second embodiments explained so far.

In this embodiment, in addition to the embodiment 2, the variable capacitance element formed by the first MOS transistor 13 and the second MOS transistor 14 is provided as a first variable capacitance. In parallel with the same, a third MOS transistor 13S is short-circuited at its source terminal S3 and drain terminal D3, to further short-connect the same with a drain terminal D4 of a fourth MOS transistor 14S. The back-gate terminals BG3, BG4 of the third and fourth MOS transistors 13S, 14S are short-circuited to the source terminal S4 of the fourth MOS transistor 14S. Meanwhile, the gate terminal G3, G4 of the third and fourth MOS transistors 13S, 14S are short-circuited together. Thus, a second variable capacitance device is constituted using a capacitance at between the source and drain terminals S3, D4 of the third MOS transistor 13S, the drain terminal D2 of the fourth MOS transistor 14S and the gate terminals G3, G4 of the third and fourth MOS transistors.

Meanwhile, in place of the second control signal S2 inputted to the variable capacitance in the embodiment 2, this embodiment is to input a first control signal to the gate terminal of the first variable capacitance device through a variation cancellation circuit 41 for canceling the temperature characteristic from the first control signal generation circuit 21. Meanwhile, in place of the first control signal S1, this embodiment is to input a second control signal to the source-drain terminal of the first variable capacitance device from the second control signal generation circuit 22 through an external voltage frequency control circuit 42 for controlling the external voltage frequency, and to input a third control signal to the source-drain terminal of the second variable capacitance device from the third control signal generation circuit 23 through a MOS transistor threshold voltage control circuit 43 for controlling the MOS transistor threshold voltage. The other is similar to that of the voltage-controlled oscillator of embodiment 2. Namely, the voltage-controlled oscillator shows an oscillator circuit constituted by an amplifier having a feedback resistance 1 forming a feedback circuit and an inverter 2, a quartz oscillator 3, and a load resistance, as shown in FIG. 3. There are connected the first and second capacitance devices noted before, as load capacitances.

This configuration is to cancel the temperature characteristic and external voltage frequency variation on the circuit elements such as the first and second MOS transistors while performing control similarly to the showing in the first and second embodiments. Furthermore, it can independently control the temperature compensation of the piezoelectric vibrator Embodiment 4

Figure 4:
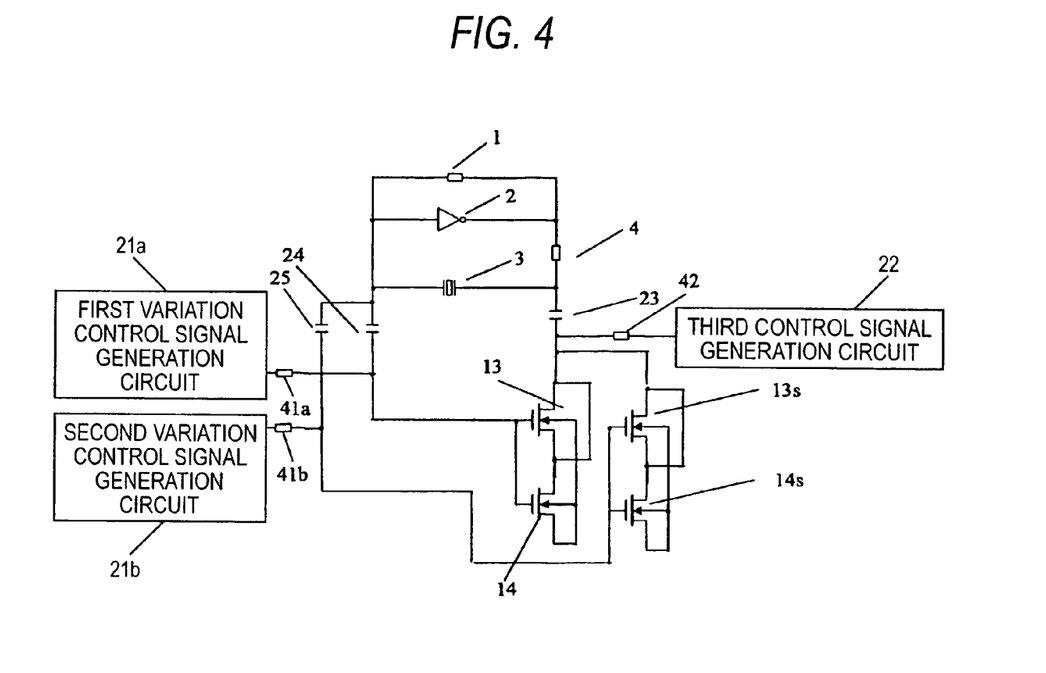
FIG. 4 is a circuit diagram showing a schematic configuration of a voltage-controlled oscillator having variable capacitance means in plurality in embodiment 4 of the invention.

FIG. 4 is a circuit diagram showing a schematic configuration of a voltage-controlled oscillator in embodiment 4 of the invention.

Embodiment 4 is similar to embodiment 3 in that the MOS transistor is divided into a plurality to form a two sets of variable capacitances. However, it is characterized in that independent control signals are to be respectively inputted also to the gate terminal of the first and second capacitance devices, as shown in FIG. 4.

This embodiment has a cancellation circuit for canceling a variation similarly to embodiment 3, to input a third control signal to the gate terminal of the first variable capacitance device from a first variation control signal generation circuit 21a through a first variation cancellation circuit 41a for canceling the temperature characteristic. Meanwhile, a sixth control signal is to be inputted to the gate terminal of the second variable capacitance device from a second variation control signal generation circuit 21b through a second variation cancellation circuit 41b for canceling a MOS-transistor threshold variation. Meanwhile, a fourth control signal is inputted to the source-drain terminal of the first variable capacitance device from a third control signal generation circuit 22 through an external voltage frequency control circuit 42 for controlling the external voltage frequency. Namely, this voltage-controlled oscillator shows an oscillation circuit constituted by an amplifier having a feedback resistance 1 forming feedback circuit and an inverter 2, a quartz oscillator 3, and a load resistance. There are connected the foregoing first and second capacitance devices, as load capacitances.

This configuration can control independently the temperature compensation control signal, the external voltage frequency control signal and circuit-element-temperature-characteristic variation control signal while performing control of the capacitance switchover voltage similarly to the showing in the first and second embodiments.

Embodiment 5

Figure 5:
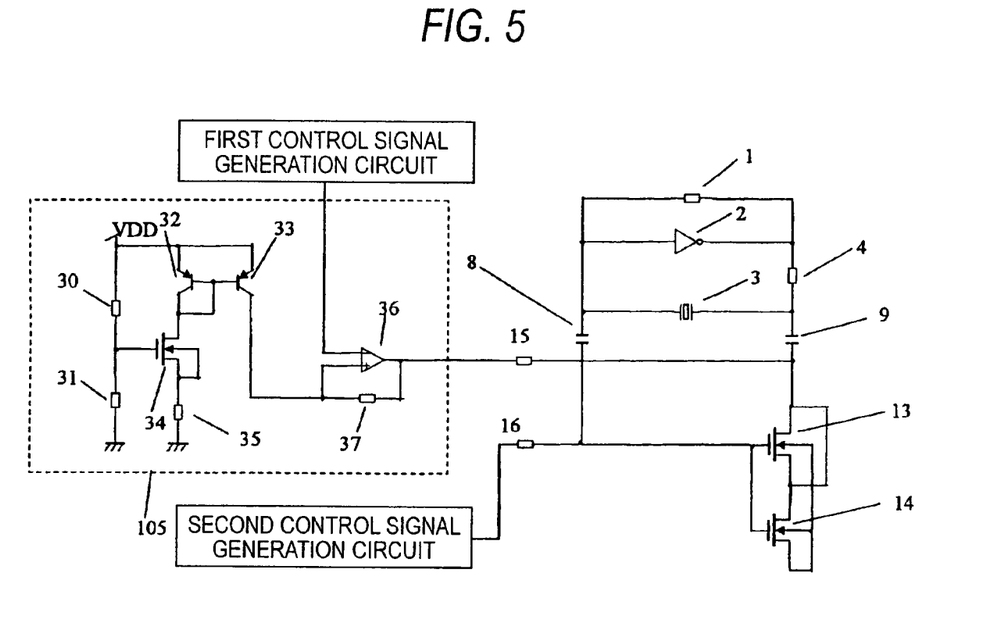
FIG. 5 is a circuit diagram showing a schematic configuration of a voltage-controlled oscillator having a variation cancellation circuit in embodiment 5 of the invention.

The voltage-controlled oscillator in embodiment 5 is configured having a variation cancellation circuit 105 having a function to cancel the MOS transistor threshold variation and temperature characteristic as shown in FIG. 5, in addition to the voltage-controlled oscillator of embodiment 2.

Adding the variation cancellation circuit 105 allows to cancel the MOS transistor threshold voltage variation and temperature characteristic variation.

The variation cancellation circuit 105 is configured by two bipolar transistors 32, 33 forming a current mirror, resistances 30, 31 connected to the sources of one of the MOS transistors, a third MOS transistor 34 connected to the drain thereof, a comparator 36 and resistances 35, 47. The other is similar to embodiment 2 shown in FIG. 2, and hence omitted to explain.

The MOS transistor has a capacitance switchover voltage to vary in the same direction as the threshold voltage of the MOS transistor. Accordingly, by inputting a signal whose voltage changes in a direction canceling the change of capacitance switchover voltage to a capacitance switchover control terminal by the variation cancellation circuit 105, the MOS-transistor threshold voltage variation and temperature characteristic can be cancelled.

Embodiment 6

Figure 6:
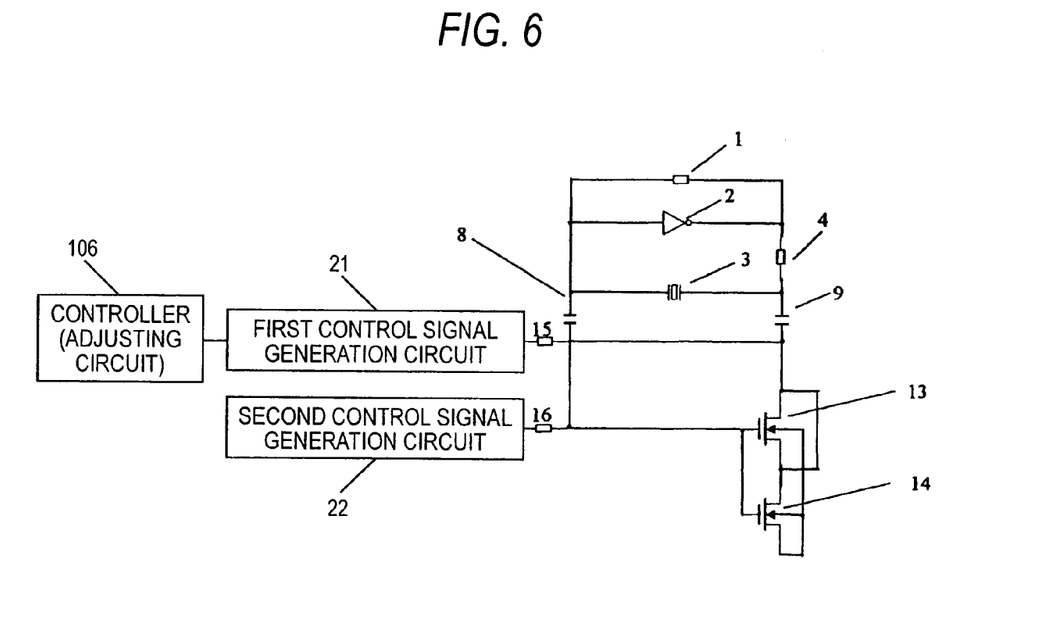
FIG. 6 is a circuit diagram showing a schematic configuration of a voltage-controlled oscillator having an adjusting circuit in embodiment 6 of the invention.

FIG. 6 is a circuit diagram showing a schematic configuration of a voltage-controlled oscillator in embodiment 6 of the invention.

Embodiment 6 is characterized in that the capacitance switchover voltage is adjusted by a value outputted from an adjusting circuit 106 previously stored, as shown in FIG. 6.

This method is enabled by storing the adjustment values in a non-volatile storage medium PROM or the like upon shipment such that a capacitance switchover voltage, for canceling the variation in MOS-transistor threshold voltage, can be applied/adjusted to the capacitance switchover control terminal during a diffusion process.

Incidentally, the embodiment, although exemplified the NMOS transistors, can be realized by use of a PMOS transistor.

The voltage-controlled oscillator according to the invention can control the oscillation frequency by use of a capacitance, as a variable capacitance, caused at between the source-drain terminal and the gate terminal of a MOS transistor whose source and drain terminals are short-circuited together, which accordingly is usable as a voltage-controlled temperature-compensation quartz oscillator or the like.

What is claimed is:

1. A voltage-controlled oscillator for use with a piezoelectric vibrator, comprising:
    an amplifier having an inverter and a feedback resistance, the amplifier having a first terminal and a second terminal; and
    a variable capacitance connected between both terminals of the amplifier, the variable capacitance being configured by a first MOS transistor and a second MOS transistor,
    wherein gate terminals of the first and second MOS transistors are commonly connected to the first terminal of the amplifier, a source terminal and a drain terminal of the first MOS transistor are short-circuited and connected to the second terminal of the amplifier, and one of a source terminal and a drain terminal of the second MOS transistor is connected to the source and drain terminals of the first MOS transistor,
    wherein oscillation voltages in opposite phases are to be applied between the source and drain terminals of the first MOS transistor and the gate terminals of the first and second MOS transistors, and
    oscillation frequency is to be controlled according to a first control signal inputted to the source and drain terminals of the first MOS transistor and a second control signal inputted to the gate terminals of the first and second MOS transistors.

2. The voltage-controlled oscillator according to claim 1, further comprising:
    a first DC-cut capacitance connected between the gate terminals and the first terminal of the amplifier; and
    a second DC-cut capacitance connected between the source and drain terminals of the first MOS transistor and the second terminal of the amplifier.

3. The voltage-controlled oscillator according to claim 1, wherein the source or drain terminal of the second MOS transistor which is not connected to the source and drain terminals of the first MOS transistor is connected to back gate terminals of the first and second MOS transistors.

4. The voltage-controlled oscillator according to claim 1, wherein the first control signal is a signal that a temperature compensation control signal and an external voltage frequency control signal are superimposed together, and the second control signal is a MOS transistor threshold voltage control signal.

5. The voltage-controlled oscillator according to claim 1, wherein the first control signal is a MOS transistor threshold voltage control signal, and the second control signal is a signal that a temperature compensation control signal and an external voltage frequency control signal are superimposed together.

6. The voltage-controlled oscillator according to claim 1, wherein terminals to which the first and second control signals are to be inputted, have a circuit having a MOS transistor threshold voltage variation canceling function.

7. The voltage-controlled oscillator according to claim 1, wherein terminals to which the first and second control signals are to be inputted, have a circuit having a temperature characteristic variation canceling function.

8. The voltage-controlled oscillator according to claim 1, wherein the terminals has an adjusting circuit having a non-volatile storage medium storing an adjusting voltage.

9. A voltage-controlled oscillator for use with a piezoelectric vibrator, comprising:
    an amplifier having an inverter and a feedback resistance, the amplifier having a first terminal and a second terminal; and
    a plurality of variable capacitances connected in parallel between the first and second terminals of the amplifier, each of the variable capacitances being configured by a first MOS transistor and a second MOS transistor,
    wherein gate terminals of the first and second MOS transistors are connected within the each of the variable capacitance and further connected to the first terminal of the amplifier, a source terminal and a drain terminal of the first MOS transistor are short-circuited within the each of the variable capacitance and connected to the second terminal of the amplifier, and one of a source terminal and a drain terminal of the second MOS transistor is connected to the source and drain terminals of the first MOS transistor within the each of the variable capacitance,
    wherein oscillation voltages in opposite phases are to be applied between the source and drain terminals of the first MOS transistor and the gate terminals of the first and second MOS transistors, and
    oscillation frequency is to be controlled according to a common control signal inputted to all of the gate terminals in the plurality of variable capacitances and a plurality of control signals inputted to each of the source and drain terminals of the first MOS transistors in the plurality of variable capacitances.

10. A voltage-controlled oscillator for use with a piezoelectric vibrator, comprising:
    an amplifier having an inverter and a feedback resistance, the amplifier having a first terminal and a second terminal; and
    a plurality of variable capacitances connected in parallel between the first and second terminals of the amplifier, each of the variable capacitances being configured by a first MOS transistor and a second MOS transistor,
    wherein gate terminals of the first and second MOS transistors are connected within the each of the variable capacitance and further connected to the first terminal of the amplifier, a source terminal and a drain terminal of the first MOS transistor are short-circuited within the each of the variable capacitance and connected to the second terminal of the amplifier, and one of a source terminal and a drain terminal of the second MOS transistor is connected to the source and drain terminals of the first MOS transistor within the each of the variable capacitance, wherein oscillation voltages in opposite phases are to be applied between the source and drain terminals of the first MOS transistor and the gate terminals of the first and second MOS transistors, and oscillation frequency is to be controlled according to a common control signal inputted to all of the source and drain terminals in the plurality of variable capacitances and a plurality of control signals inputted to each of the gate terminals of the first MOS transistors in the plurality of variable capacitances.

* * * * *